United States Patent [19]

Slenker

[11] 3,824,518

[45] July 16, 1974

[54] MINIATURIZED INDUCTIVE COMPONENT

[75] Inventor: Stephen A. Slenker, Tyngsboro, Mass.

[73] Assignee: Piconics, Inc., Tyngsboro, Mass.

[22] Filed: Mar. 5, 1973

[21] Appl. No.: 338,265

[52] U.S. Cl. .................... 336/96, 29/602, 264/274, 336/192

[51] Int. Cl. .................... H01f 15/02

[58] Field of Search .................... 336/96, 205, 192; 174/52 PE; 29/602; 264/273, 274, 272

[56] References Cited

UNITED STATES PATENTS

| | | | |
|---|---|---|---|
| 2,391,038 | 12/1945 | Rifenbergh | 174/52 PE |
| 2,392,311 | 1/1946 | Christopher | 174/52 PE |
| 2,850,687 | 9/1958 | Hammes | 336/96 X |
| 2,993,082 | 7/1961 | Gainer et al. | 174/52 PE |
| 3,201,729 | 8/1965 | Blanchi et al. | 336/96 X |
| 3,259,861 | 7/1966 | Walker | 336/96 X |
| 3,321,168 | 5/1967 | D'Entrement | 336/96 |
| 3,501,582 | 3/1970 | Heidler et al. | 174/52 PE |
| 3,541,478 | 11/1970 | Peterson et al. | 336/96 X |

*Primary Examiner*—Thomas J. Kozma

[57] ABSTRACT

There is disclosed an inductive component including a ceramic substrate having metalized strips affixed thereto, an inductive element preferably in the form of a coil wound upon a ferrite core attached to the strips, and an epoxy encapsulent enclosing the inductive element and forming with the ceramic substrate a unitary inductive component. The substrate is constructed with oppositely sloping walls arranged to provide an interlocking dovetail arrangement with the encapsulent thereby providing an improved bonding therebetween to prevent separation between the substrate and encapsulent when the component is soldered in a circuit.

7 Claims, 9 Drawing Figures

MINIATURIZED INDUCTIVE COMPONENT

FIELD OF THE INVENTION

The present invention relates in general to an improved miniaturized inductive component. More particularly, this invention is concerned with an inductive component that is characterized by an improved interlocking construction wherein the parts comprising the component do not separate upon application of heat thereto.

BACKGROUND OF THE INVENTION

In constructing a typical microelectronic inductor high temperature epoxies or silicones have been used to secure the inductive element to the substrate. The adhesive forces between the epoxy and substrate at low temperatures is usually quite adequate. However, at the temperatures imposed upon the component when being soldered into a circuit, it has been determined that the adhesive forces of even the best high temperature epoxies are extremely low at these elevated temperatures. When the component is elevated in temperature to the solder heat range, forces in excess of approximately 0.25 lbs. have been found to cause separation between the substrate and encapsulent.

Generally, an inductive component is applied to a circuit board, for example, by heating the substrate with the inductive component in its proper position, the heating continuing until the solder is melted. Many times, the inductor is rubbed against the sides with a soldering iron. Also, pressure may be applied against the sides of the inductor for causing a repositioning and to obtain a good bond to the substrate. Usually, a solder fillet is formed on the edges of the component by the use of the soldering iron.

Moreover, if an inductor is to be removed from the circuit board, the inductor must be reheated and pressure must be applied to the conductor to facilitate its removal.

The combination of the elevated temperatures necessary for causing the melting of the solder, in conjunction with the forces normally applied frequently caused the encapsulent, and in turn the inductive coil to become separated from the metalization provided on the ceramic substrate. Also, if a separation takes place the solder flux can penetrate into the component further weakening the bond and causing the device to separate into two pieces.

Accordingly, it is an object of the present invention to provide an improved miniaturized inductive component characterized by an improved interlocking construction wherein the parts comprising the component do not separate upon application of heat thereto.

Another object of the present invention, is to provide an improved inductive component comprising a preferably ceramic substrate having oppositely sloping walls arranged to provide an interlocking dovetail joint with the encapsulent.

A further object of the present invention is to overcome the problems referred to herein before and provide an improved inductive component that is not characterized by a separation between the encapsulent and the substrate when solder heat is applied.

SUMMARY OF THE INVENTION

To accomplish the foregoing and other objects of this invention, the miniature inductive component comprises a substrate having spaced metal strips affixed at opposite ends thereof, an inductive element, and an encapsulent surrounding the inductive element and forming a unitary piece with the substrate. The inductive element is preferably in the form of a coil of wire wound upon a core with the ends of the wire connecting to the spaced metal strips. The substrate has one surface in facing relationship to the coil and has oppositely sloping sidewalls that diverge toward the one surface thereof. The encapsulent surrounds the coil and is disposed adjacent the sloping sidewalls so that the encapsulent forms a dovetail joint with the substrate.

In an alternate embodiment of the present invention, the substrate is formed with oppositely spaced metal strips having metal posts associated therewith extending from the substrate and disposed normal to the plane of the substrate. The inductive element preferably in the form of a coil of wire has its ends attached to the respective posts. An epoxy encapsulent encases the inductive element and forms a unitary piece with the substrate. The posts provide an improved bond between the substrate and encapsulent.

In still another arrangement the ceramic substrate has a straight or tapered hole therein that fills with epoxy to form a joint. In another structure the sidewalls are stepped rather than sloped.

BRIEF DESCRIPTION OF THE DRAWINGS

Numerous other objects, features and advantages of the present invention will now become apparent upon a reading of the following detailed description taken in conjunction with the accompanying drawing in which.

DETAILED DESCRIPTION

Figure 1:
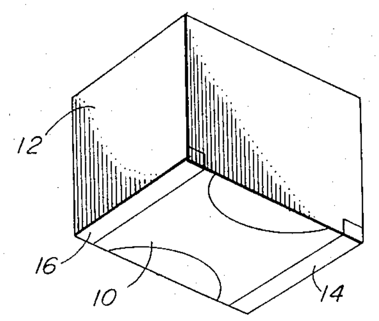
FIG. 1 is a perspective view of an inductive component of this invention.
Figure 4:
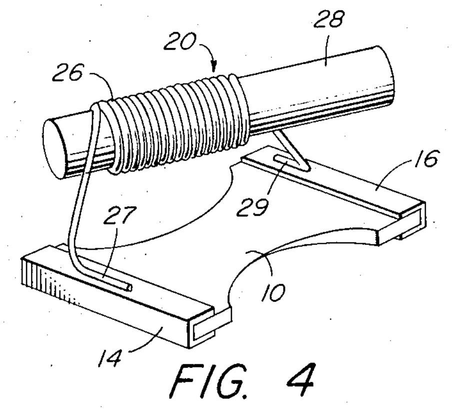
FIG. 4 is a perspective view showing the inductive element in position affixed to the substrate.

Referring now to the drawings, and particular to FIG. 1, there is shown the inductive component of the present invention which generally comprises a ceramic substrate 10 and epoxy encapsulent 12. The ceramic substrate 12 has metal members 14 and 16 affixed at opposite ends thereof. The inductive element 20 which is encapsulated in FIG. 1 and disclosed in one embodiment in FIG. 4 is affixed at its ends to members 14 and 16.

In constructing the device of this invention, the ceramic substrate 10 is purchased as a conventional item with the metal members 14 and 16 affixed thereto. The metal members, as is well known in the art, may be constructed of alloys of molybdenum, magnesium or tungsten, and are fired on at 1,500°C so that the metal fuses with the ceramic substrate. The members 14 and 16 may then be plates thereafter with nickel or gold.

Figure 2:
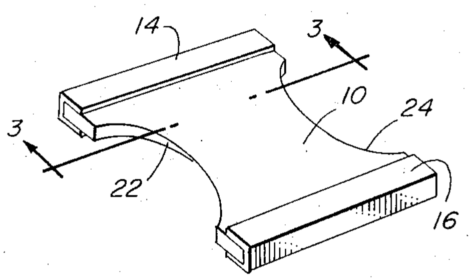
FIG. 2 is a perspective view showing one embodiment for the substrate of FIG. 1.
Figure 3:
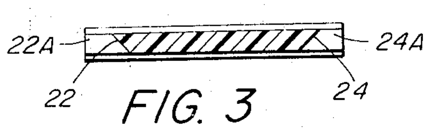
FIG. 3 is a cross-sectional view taken along line 3—3 of FIG. 2.

The substrate that is purchased may be rectangular in shape and is ground as shown in FIGS. 2 and 3 to define slanted sidewalls 22 and 24. When viewed from the top the substrate has arcuate notches that will fill with the epoxy when the entire device is formed.

These notches defined by the slanted and arcuate sidewalls 22 and 24 may be formed by using a cylindrical grinding wheel that is disposed at an angle of, for example, 45° to the plane of the substrate.

FIG. 4 shows the inductive element 20 as including a coil of wire 26 wound about a core 28 which may be a ferrite or powdered iron core. The ends 27 and 29 of coil 26 attached respectively to members 14 and 16. These ends may be affixed to the members by spot welding.

It is also preferred an epoxy pad (not shown) be initially used for supporting the inductive element relative to the substrate. This epoxy pad would thus be disposed in FIG. 4 between the coil 26 and the flat upper surface of the substrate.

After the inductive element has been affixed to the substrate, the partially constructed device can be inserted into a mold (not shown) and the inductive element is covered by epoxy encapsulent 12 shown in FIG. 1. A pour molding, transfer molding or compression molding technique can be used for forming the encapsulent 12. The device than takes the form shown in FIG. 1. A solder coating can be provided on the exposed surfaces of members 14 and 16.

It is noted that when the encapsulent is formed above the substrate as shown in FIG. 3, for example, the encapsulent flows into spaces 22A and 24A formed respectively by sidewalls 22 and 24 thereby defining a dovetail joint between the substrate and the encapsulent. The substrate when initially purchased is not provided at all with the sidewalls as shown in FIG. 2 but it is only in accordance with the teachings of the present invention that the sidewalls are formed to provide the dovetail joint.

Figure 5:
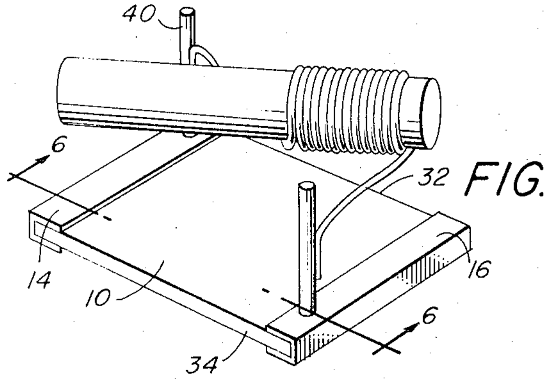
FIG. 5 is a perspective view of the substrate and inductive element for an alternate embodiment of this invention.

In the following discussion relating to FIGS. 5 and 6 like reference characters will be used where appropriate. FIG. 5 shows a view quite similar to that previously shown in FIG. 4 including a substrate 10, inductive element 20, and metal members 14 and 16. In this embodiment, however, the substrate 10 is generally rectangular and has straight sidewalls 32 and 34.

Figure 6:
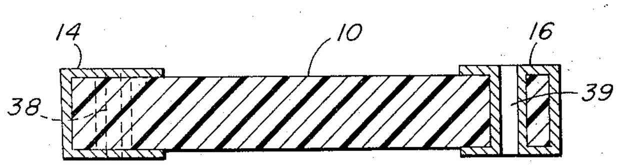
FIG. 6 is a cross-sectional view taken along line 6—6 of FIG. 5.

FIG. 6 is a cross-sectional view taken along line 6—6 of FIG. 5 showing the metal members 14 and 16 which are affixed to the substrate preferably in the same manner as previously discussed with reference FIGS. 1–4. In this embodiment prior to forming the metal members 14 and 16 the substrate in its "green state" has holes 38 and 39 drilled therethrough. When the metalization takes place forming the members 14 and 16 the metal is also deposited within the holes 38 and 39. The posts 40 and 41 may be inserted within the holes 38 and 39. These posts may be 5 to 20 mil wire. In FIG. 5, the size of the post is exaggerated. The posts are preferably brazed with their respective members.

After the device has been formed as shown in FIG. 5 the mold is then used to encapsulate the inductive element and form a unitary device similar to that shown in FIG. 1. The posts 40 and 41 provide a good bond between the substrate and the encapsulent and prvent separation therebetween even when solder heat is applied to the device.

Figure 7:
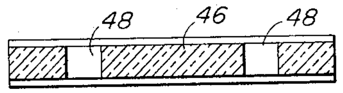
FIG. 7 is a cross-sectional view of another embodiment of the substrate.
Figure 8:
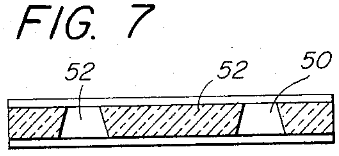
FIG. 8 is a cross-sectional view similar to the one of FIG. 7 for still another embodiment.
Figure 9:
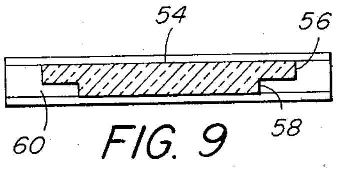
FIG. 9 is a cross-sectional view similar to the one of FIG. 3 for stepped sidewalls.

FIG. 7 is a cross-sectional view showing another structure of this invention including a substrate 46 having a pair of holes 48 extending therethrough. Holes 48 fill with epoxy to provide a bond between the encapsulent and substrate. In the embodiment of FIG. 8 the substrate 50 has holes 52 that are tapered at approximately 15°. The embodiment of FIG. 9 shows substrate 54 having at stepped sidewall 58 positioned inward of wall 56 to provide area 60 which fills with the encapsulent to provide a bond with the substrate. The stepped sidewalls may be either arcutate or straight.

Having described a limited number of embodiments of the present invention, it should now be obvious that numerous modifications can be made therein, all such modifications being contemplated as falling within the scope of this invention. For example, for embodiment shown in FIGS. 1–4 the sidewalls defining the dovetail joint are shown as continuous. In an alternate embodiment, the sidewalls could be toothed to form a series of dovetail joints. Also, instead of an arcuate shape to the notches as viewed from the top of the substrate (see FIG. 2), the notch could be of a square or rectangular shape in that view with the sidewalls still being slanted.

What is claimed is:

1. A miniature inductive component comprising;

a ceramic plate-like quadrilateral-shaped substrate having pairs of opposing side walls, a pair of metal members spacedly disposed and each affixed at and extending along opposite respective side walls of one pair of opposing side walls of said substrate, an inductive element having opposite ends each coupling respectively to one of said metal members of said pair of metal members, said substrate having one surface in facing relationship to said element, each of the other pair of opposing side walls of said substrate having a notched section, and an encapsulant surrounding said element and disposed in said notched section and forming opposite joints with said substrate.

2. The component of claim 1 wherein the sidewall of the notched section is slanted and the opposite slanted side walls diverge in the direction of said one surface.

3. The component of claim 2 wherein each said notched section is arcuate being provided by a grinding at an angle to the plane defined by the plate-like substrate.

4. The component of claim 3 wherein the notched sections are symmetrically disposed and provide a reduced distance between the slanted walls at the middle of the substrate.

5. The component of claim 4 wherein each of the other pair of opposing side walls includes straight wall sections separated by said notched section.

6. The component of claim 5 wherein each said metal member is U-shaped and forms metal strips along the entire length of said one pair of opposing side walls.

7. The component of claim 6 wherein said inductive element includes a coil of wire and a core having the wire wound on the core, said core being arranged to extend in a direction between opposite corners of said substrate.

* * * * *